United States Patent [19]

Riegert

[11] 4,201,645
[45] May 6, 1980

[54] CLOSED-LOOP SPUTTERING SYSTEM AND METHOD OF OPERATING SAME

[75] Inventor: Richard P. Riegert, Santa Barbara, Calif.

[73] Assignee: Robert J. Ferran, Framingham, Mass.

[21] Appl. No.: 919,435

[22] Filed: Jun. 26, 1978

[51] Int. Cl.² ............................................. C23C 15/00
[52] U.S. Cl. .................................. 204/192 R; 204/298
[58] Field of Search ........................... 204/192 R, 298

[56] References Cited

U.S. PATENT DOCUMENTS

| 4,043,889 | 8/1977 | Kochel | 204/298 |
| 4,115,184 | 9/1978 | Poulsen | 204/298 |

FOREIGN PATENT DOCUMENTS 2232832 1/1975 France .................................. 204/192 R

OTHER PUBLICATIONS

Pressure Control of RF Bias for Sputtering, L. J. Kochel; Rev. Sci. Instrum., vol. 47, No. 12, Dec., 1976, pp. 1556–1557.

Primary Examiner—John H. Mack
Assistant Examiner—William Leader
Attorney, Agent, or Firm—Richard P. Crowley

[57] ABSTRACT

A closed-loop sputtering system for the deposition of thin films which includes a control means to maintain and control the voltage of the target electrode by control of the flow of gas to the plasma without measurement of the pressure of the system.

16 Claims, 1 Drawing Figure

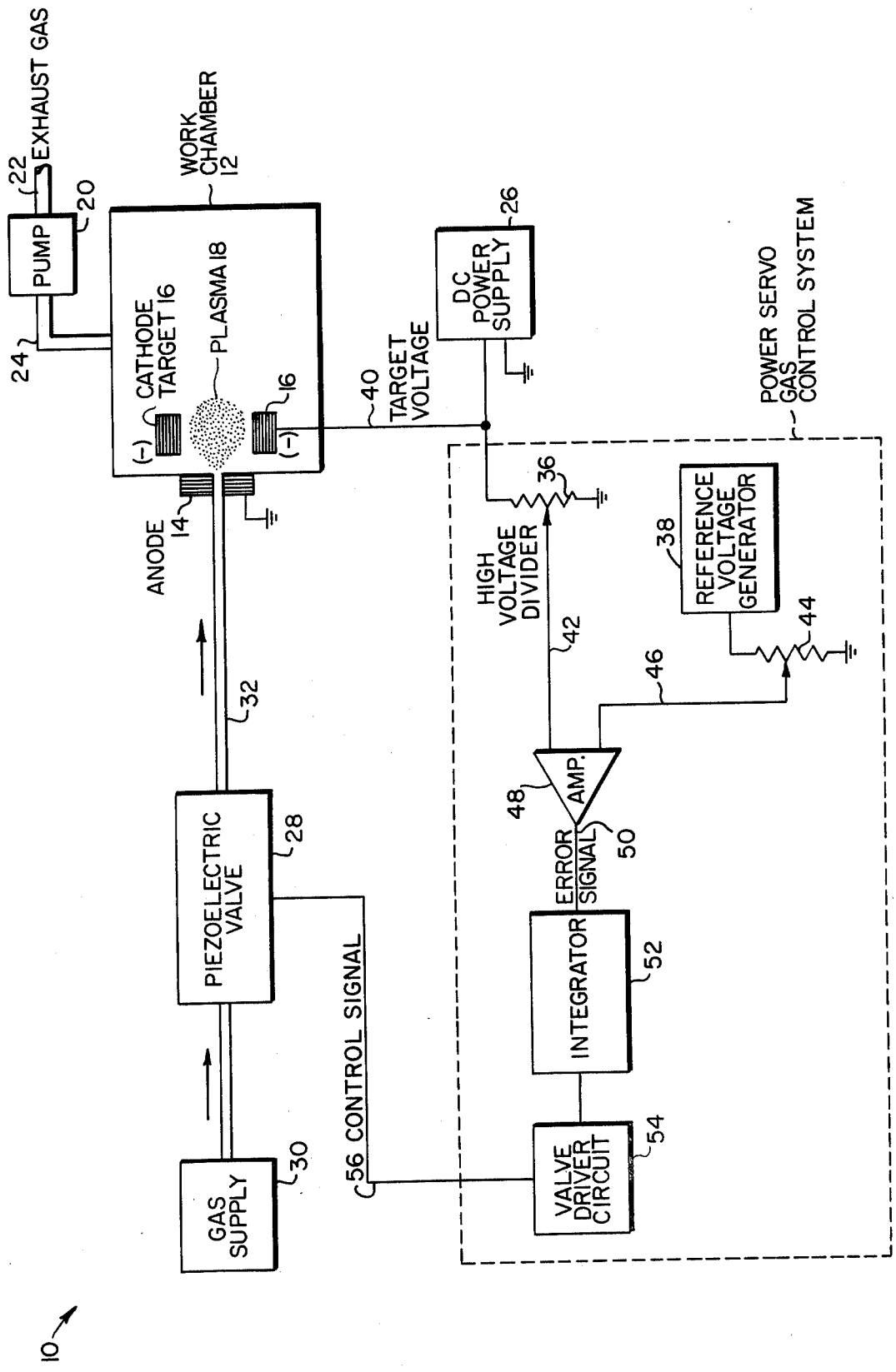

CLOSED-LOOP SPUTTERING SYSTEM AND METHOD OF OPERATING SAME

BACKGROUND OF THE INVENTION

Closed-loop sputtering systems have been employed to deposit thin films of a material, such as a metal or metal oxide, in a controlled manner onto a substrate surface. Typically such closed-loop sputtering systems operate through the creation of a plasma of ionized gas between target (cathode) and anode electrodes whereby in operation a molecular film of the target electrode is deposited and condensed in a thin-film form onto a substrate between the electrodes.

In DC sputtering systems of the types now in use, control of the plasma in a sputtering work chamber containing the electrodes is accomplished by monitoring the pressure of the gas within the work chamber through the use of a transducer as a pressure-sensing device to provide an error-output signal in reference to a preset reference signal with the error signal obtained by a comparison of the electrical signal from the pressure in the chamber to the reference signal to provide for an error-control signal to a piezoelectric valve, which valve in turn proportionally controls the flow of the ionizable gas to the plasma. The error signal from the control sets the valve opening so as to maintain the pressure of the work chamber at a desired level.

In the pressure-controlled system there are typically pressure gradients in the work chamber which are functions of the geometry of the chamber. As parts move in the field of flow this gradient is typically altered. In addition, the pressure transducer is usually remote from the plasma and thus measures the pressure with a variable error depending on the flow and geometry of the chamber. Thus, the pressure control is variable due to these factors as well as the time delay in said plasma disturbances in pressure output and the errors in changing from transducer to transducer, all of which are overcome through the use of my invention.

Present DC closed-loop sputtering systems are directed to maintaining the lowest-possible pressure level within the work chamber, that is at a base pressure level, for example, of about 1 micron, which will permit the continuous nonextinguishing operation of the plasma. However, such systems have disadvantages in that the pressure level of the work chamber must be maintained at a level sometimes 3 to 5 times or more higher than the base pressure level in order to compensate for pressure fluctuations in the work chamber during operation of the plasma and for a response time and inaccuracies in the pressure transducer and in the operation of the piezoelectric valve in the system. Thus, the pressure level is often much higher than the base pressure to compensate for such variations and to prevent the plasma from extinguishing by having the pressure fall below the base pressure. In order to obtain thin films of uniform thickness and structure it is most desirable to maintain a high degree of control over the operation of the plasma in the work chamber and to operate continuously at a pressure just above the base pressure. Therefore a closed-loop sputtering system to provide for a better control of the plasma and at a lower level than possible by present systems would be most desirable in that the sputtering system would produce a higher-quality controlled and more uniform film.

SUMMARY OF THE INVENTION

My invention relates to an improved closed-loop sputtering system and to a method of operating such system. In particular my invention concerns a closed-loop constant-current sputtering system and method of operation through control of the target voltage by varying the gas flow to the plasma thereby permitting the system to operate at a lower plasma pressure than possible with a prior-art pressure-controlled system and method of operation and without the need to measure pressure of the work chamber.

I have discovered an improved sputtering system wherein controlling and monitoring of the electrical power, such as the target voltage to the electrodes, to control the flow of gas to the plasma, rather than by the use of a pressure transducer to control the pressure in the chamber, provide for new and unexpected results and overcome many other disadvantages of the prior-art pressure-controlled sputtering systems. My system operates through controlling the working power of the plasma by altering the flow of gases into the plasma formed in the work chamber to hold the power constant rather than to control the pressure in the chamber through the use of an expensive transducer as in prior-art systems. My system provides for effective and rapid control of the pressure of the plasma without the use of a pressure transducer and further results in a precise control of the conditions of the plasma and the elimination of many inaccuracies due to pressure gradients caused by the flow of gas through the chamber. My system and method of operation not only provide certain substantial cost savings through the elimination of the pressure transducer and its adjunctive circuitry, but in addition provide for a better and more effective control of the parameters of the system thereby resulting in film materials of a smoother nature, with less induced stress, smaller grain size, and uniform and repeatable film thickness. In addition my system and operation provide an advantage of operating at a lower gas pressure, and less gas inclusion results together with lower partial pressures of any contaminant vapors and also with a longer free mean path of the plasma gas resulting in higher-energy films. High-energy films result in better adhesion of said films to the substrate and more efficient use of target material. Furthermore, my system permits operation at higher voltage which is obtainable at lower pressures.

The principle of operation of my system is simple and effective. The electrical resistance of the plasma formed in the work chamber is a function of the gas density of the plasma where a constant current is supplied, such as from a constant-current DC-power supply. The voltage across the plasma is the current-resistance product. If the gas flow through the plasma is adjusted the resistance can be set as desired and therefore, the gas flow to the plasma will then set the voltage value. The voltage times the current is the plasma power. In my system, for example, with the use of a constant-current DC-power source, a flow of ionizable gas is maintained by the closed-loop control to hold the target voltage constant at a desired value by maintaining a constant-preset voltage through the use of a direct feedback loop. The alternative technique which could be used, of course, would employ a constant-voltage supply and compare the measured current with a desired current, producing an appropriate error signal to admit gas as needed to set the target current. Either technique holds the power constant.

In operation with a constant-current DC-power source the voltage supply to the target electrode is whatever is necessary to maintain the constant current. The voltage necessary to produce a desired current decreases as the pressure increases due to the addition of gas to the chamber. I have discovered a simple and effective system and method for comparing target voltage in a DC-constant-current closed-loop sputtering system to a reference voltage and through such comparison and production of an error-control signal which controls an electrically operated valve, such as a piezoelectric valve, to alter and control the flow of gas to the plasma through the variations in the target voltage. My closed-loop system and method of operation permit effective and continuous operation of a plasma just above the base-pressure level to keep the plasma continuously energized and avoid the random fluctuations which tend to extinguish the plasma periodically at the same pressure levels where a pressure transducer or a pressure-controlled system is employed.

My system and method of operation will be described in particular in connection with a preferred embodiment for the purposes of illustration only; however, it is recognized that various changes and modifications may be made in my system and method of operation as described and illustrated without departing from the spirit and scope of my invention.

BRIEF DESCRIPTION OF THE DRAWING

The FIGURE shows a schematic illustration of a DC-closed-loop sputtering system which includes a power-servo gas-control system.

BRIEF DESCRIPTION OF THE EMBODIMENT

My closed-loop system 10 comprises a sputtering work chamber 12 which work chamber contains therein a grounded anode 14 and a substrate on which target material is to be deposited and a spaced-apart target cathode electrode 16 and wherein in operation there is formed a plasma 18 of an ionized gas. Various forms and configurations of the target and anode electrodes may be used with a ring-target electrode described for the purposes of illustration only. The work chamber 12 is maintained under a subatmospheric pressure through the use of a pump such as one or more vacuum and diffusion pumps 20 through which exhaust gases are evacuated through an exhaust conduit 24 and discharged to the atmosphere. The pump 20 would maintain the work chamber 12 at a vacuum below the base pressure for the operation of the plasma and as such typically ranges from about 0.1 microns to above 1 micron and typically 1 to 5 microns although the exact pressure depends upon the gases, geometry and materials being employed.

A power supply 26, such as a DC power supply which provides for a constant current, is employed and electrically communicates through a target-voltage line 40 with the target cathode 16. A gas supply 30 is employed to provide an ionizable gas to form the plasma within the work chamber 12. The gas is introduced into the work chamber 12 to form the plasma 18 through gas-supply line 32. The gas-supply line as shown and illustrated is a single nozzle; however, multiple nozzles may be employed. In the gas-supply conduit 32 there is a gas-flow control valve which is operated electrically between an open and a closed position and which is illustrated as a piezoelectric valve 28. The piezoelectric valve 28 is designed to be proportional in nature and to control the supply of gas from the gas source 30 through the gas-supply line 32 to the plasma 18. The valve 28 typically operating on an error-control signal from a control system is illustrated in dotted lines. It is preferred that a high-speed valve such as the piezoelectric-type illustrated be used having response times for small disturbances in the microsecond range.

In the system as illustrated a control system is employed to compare the voltage of the target cathode to a reference voltage and to provide the piezoelectric valve 28 with an error-control signal to provide for direct control of the gas supply from supply 30 through line 32 to plasma 18 and thereby control the target voltage and secondarily the pressure within the work chamber 12 without the need to employ a pressure transducer as in the prior art.

The control system comprises a high-voltage divider 36, in electrical communication with the target-voltage line 40 wherein, for example, the DC-power supply 26 is 1,000 volts. The voltage divider should be in ratio of about 100 to 1 to provide a voltage of about 10 volts. Of course, the high-voltage divider 36 may not be required if a lower-control voltage may be monitored directly from the power supply 26. The system includes a reference-voltage generator 38 with a reference-voltage potentiometer 44 which may be set forth in a front panel with a calibrated dial so that a reference voltage may be selected by the user, such as for example, from 0 to −10 volts. The selected reference voltage communicates through line 46 with the reduced target voltage communicating through line 42 to a differential amplifier 48 which compares the target-voltage line 42 and the reference-voltage line 46 to produce an error-control signal in line 50 which communicates with an integrator 52. Since some voltage is often required to maintain the piezoelectric valve 38 in an open condition and to maintain the plasma 18, the integrator improves the control and accuracy of the system 10. The integrated error-control signal from the integrator 52 directly communicates with a valve-driver circuit 54 which provides for proportional voltage to drive the valve 28 to the proper position through line 56.

Thus, in essence the control system provides, if necessary, for the reduction in the voltage to a voltage-signal level and then compares the variable of the target voltage from the high-voltage divider 36 through line 42 with the internally generated voltage through the preset and fixed reference-voltage generator 38 and potentiometer 44. The voltage out of the differential amplifier 48 then equals the difference between the two input signals, the target voltage and the reference voltage, and this error-control signal through line 50 is then integrated and sent to the valve-driving circuit. If the divided cathode target voltage exceeds the divided reference voltage, then the valve is proportionally opened to permit more gas from the gas source 30 through line 32 through the valve 28 into the plasma to increase the current to maintain a steady-state condition. The piezoelectric-valve opening 28 is designed to be merely sufficient to allow the needed gas to the plasma 18 to hold the target voltage of the target cathode 16 at the desired constant value.

The described embodiment is shown in a simple schematic illustration and it is recognized that, for example, other optional components may be added to the closed-loop system 10, such as, for example, the flow meters in the gas-supply line 32, as well as, for example, tolerance circuits. Tolerance relays may be employed in the error-signal line 50 communicating with the integrator 50, as well as a deviation meter which may be employed to measure the amount of error where desired. In addition a drive meter may be employed, for example, after the valve driver 54 and the valve driver 54 may produce an error-control signal line 56 to feed one or more piezoelectric valves 28.

In summary my invention provides for an improved closed-loop sputtering system and method of operation which will allow and improve deposition characteristics, greater process repeatability, more accurate control and total automation of the system, while also reducing the cost of the system over that of the prior art. My system controls the plasma voltage or current directly and precisely by adjusting the flow of gas into the work chamber by taking the high-voltage output or the control signal from a power supply and comparing it to a desired set point and adjusting the flow of gas in a very high-speed servo loop to result in direct and absolute control of the plasma and providing for an extremely stable plasma and voltage or current. My system, due to its fast response, produces stability and permits operation at significantly higher voltage and lower pressures as possible under manual control or under pressure control alone.

What I claim is:

1. A closed-loop sputtering system for the deposition of a thin film of material from a target cathode onto a substrate, which system comprises in combination:
    (a) a D.C. power source to apply a constant current or voltage;
    (b) a sputtering work chamber containing therein a target cathode, a substrate and an anode, the electrodes spaced apart and adapted to form in operation a plasma of an ionized gas therebetween;
    (c) a means to maintain the work chamber under a vacuum and to discharge exhaust gas from the work chamber in operation;
    (d) a source of gas for use in forming the plasma;
    (e) gas conduit means to conduct the gas from said source to the work chamber to form the plasma;
    (f) electrically controlled gas-flow valve means in the conduit means, the valve means to control the flow of gas therethrough in proportion to the application of an electrical error signal to the valve means;
    (g) first electrical-communication means to provide for electrical communication between the D.C. power source and the cathode, so as to provide a constant current or voltage to the target cathode; and
    (h) control means in direct nonbiased electrical communication with the target cathode and with the gas-flow valve means, said control means comparing the target voltage or current signal which varies with the ionization level of the plasma in the work chamber with a reference voltage or current signal and generating a differential electrical-error-control signal to control and drive the valve means, whereby the ionization level of the plasma is controlled by variations in the flow of gas without the necessity of a pressure-sensing device in the work chamber.

2. The system of claim 1 wherein the power source is a DC-constant-current-power source and wherein the valve-control means compares the target-electrode-voltage signal with a reference-voltage signal to provide an error-control-voltage signal to the valve means.

3. The system of claim 1 wherein the means to maintain the vacuum chamber under vacuum comprises a vacuum pump to maintain the chamber at a pressure below about 5 microns.

4. The system of claim 1 wherein the source of gas comprises inert gas, reactive gases or combinations thereof.

5. The system of claim 1 wherein the valve means comprises a piezoelectric-leak valve.

6. The system of claim 1 wherein the target electrode is composed of a metal, metal alloy or a metal oxide.

7. The system of claim 2 wherein the control means comprises in combination a high-voltage divider to reduce the target voltage from the target cathode, a reference-voltage generator to provide a reference voltage, a differential amplifier to compare the divider-target voltage and the reference voltage as it generates an error signal, and a valve-driver circuit to receive the error signal and to control the flow of the gas to the plasma through variations in the valve means, whereby the valve means is opened and whereby, on receipt of an error-control signal from the valve-driver circuit, the valve means is open to admit additional gas from said source to the plasma, wherein the plasma is maintained in a steady state through a valve opening sufficient to permit the plasma to hold the target voltage at the desired constant level.

8. The system of claim 7 which includes, between the differential amplifier and the valve-driver circuit, an integrator circuit to integrate the error-control signal received from the differential amplifier and to integrate the signal to control variations in the operation of the valve means.

9. A closed-loop sputtering system for the deposition of a thin film of material from a target cathode onto a substrate, which system comprises in combination:
    (a) a DC-constant-current-power source;
    (b) a sputtering work chamber containing therein a metal, metal alloy or metal-oxide target-cathode, a substrate and an anode, the electrodes spaced apart to form in operation a plasma of an ionized gas therebetween;
    (c) a pump means to maintain the work chamber under a vacuum at a level above the base pressure for the operation of the plasma and to discharge exhaust gas from the work chamber in operation;
    (d) a gas supply, wherein the gas comprises argon, other inert gases, reactive gases or combinations thereof, for use in forming the plasma;
    (e) a gas-conduit means to conduct the gas from the gas supply to the work chamber to form the plasma;
    (f) a piezoelectric-leak valve in the gas-conduit means to control the flow of gas therethrough in proportion to the application of an electrical-error-voltage signal to the piezoelectric-leak valve;
    (g) a target-voltage line to provide direct, nonbiased, electrical communication between the DC-constant-current source and the target cathode, so as to provide a constant current to the target-cathode;
    (h) a power-servo gas-pressure-control means in electrical communication with the target cathode and with the piezoelectric valve to compare the target voltage with a reference-voltage signal and to generate a differential electrical-voltage-control signal to drive the piezoelectric valve, which means comprises:
(i) a high-voltage divider to reduce the target voltage from the target cathode,
(ii) a reference-voltage generator to provide a reference voltage,
(iii) a differential amplifier to compare the divider-target voltage and the reference voltage as it generates an error signal; and
(i) an integrator circuit between the differential amplifier and the valve-driver circuit to integrate the error-control signal received from the differential amplifier and to control variations in the operation of the piezoelectric-leak valve, whereby the target cathode potential is monitored by the differential amplifier to detect changes in the ionization level of the plasma and whereby the error signal of the differential amplifier is processed by the integrator and used to control the ionization level of the plasma by variations in the flow of gas through the piezoelectric-leak valve without the necessity of a pressure-sensing device in the work chamber.

10. A method of operating a closed-loop sputtering system, which method provides for the deposition of a thin film of material from a target cathode onto a substrate in a controlled manner, which method comprises:
(a) maintaining a vacuum in a work chamber, which work chamber includes spaced-apart a target-cathode and an anode;
(b) applying a constant current or voltage from a D.C. power supply to the cathode;
(c) employing an ionizable gas between the electrodes to create a plasma of ionized gas therebetween and to provide for the deposition of a thin film of the target electrode onto a substrate;
(d) controlling the flow of the ionizable gas into the work chamber and to the plasma independent of the pressure of the gas in the work chamber by directly comparing the DC current or voltage of the cathode, which varies with the ionization level of the plasma, to a reference current or voltage to generate an error signal based on such comparison; and
(e) employing the error signal so generated to operate a valve means which controls the flow of the gas to the plasma, whereby the ionization level of the plasma is controlled by variations in the flow of gas without the necessity of a pressure-sensing device in the work chamber.

11. The method of claim 10 wherein the ionizable gas comprises inert gas, reactive gases or combinations thereof.

12. The method of claim 10 wherein the work chamber is maintained under a vacuum of from about 1 to 10 microns.

13. The method of claim 10 wherein the target electrode is composed of a metal, metal alloy or metal oxide to be deposited on the substrate.

14. The method of claim 10 wherein the power source is a DC-constant-current source, which method comprises comparing the voltage of the target cathode to a reference voltage to generate a voltage-error signal, whereby control of the gas maintains the target voltage constant.

15. The method of claim 14 wherein the flow of the gas to the plasma is controlled through the employment of a piezoelectric-leak valve, the valve opening and closing in proportional response to the electrical voltage-error signal.

16. The method of claim 10 wherein control of the flow of the gases includes reducing the variable current or voltage from the target cathode by a suitable divider, comparing the divided voltage or current with a suitable reference voltage or current generated, and amplifying the difference to generate an error-control electrical signal for driving a piezoelectric-leak valve.

* * * * *